United States Patent [19]

Boudot et al.

[11] Patent Number: 4,864,384
[45] Date of Patent: Sep. 5, 1989

[54] PRE-MATCHED MODULE FOR AN ULTRA-HIGH FREQUENCY DIODE AND A PROCESS FOR FORMING THE BIASING CONNECTION FOR THE DIODE

[75] Inventors: Marianne Boudot; Michel Heitzmann, both of Paris, France

[73] Assignee: Thomson CSF, Paris, France

[21] Appl. No.: 37,128

[22] Filed: Apr. 10, 1987

Related U.S. Application Data

[63] Continuation of Ser. No. 477,488, Mar. 21, 1983, abandoned.

[30] Foreign Application Priority Data

Mar. 23, 1982 [FR] France ............................... 82 04920

[51] Int. Cl.[4] .............................................. H01L 23/48
[52] U.S. Cl. ........................................ 357/68; 357/51; 357/79; 357/81
[58] Field of Search ..................... 357/51, 68, 69, 79, 357/81

[56] References Cited

U.S. PATENT DOCUMENTS 3,931,635  1/1976  Sundström ........................... 357/79
4,415,025  11/1983  Horvath ................................ 357/79

FOREIGN PATENT DOCUMENTS 2284195  of 0000  France .

OTHER PUBLICATIONS

Nachrichten Electronik, vol. 33, No. 4, Apr. 1979, Heidelberg, "Millimeterwellen-Halbleiter und Systeme Teil 2", pp. 118–123.
POEE Journal, vol. 72, No. 4, Jan. 1980, Pilgrim et al, pp. 220–227.

Primary Examiner—Edward J. Wojciechowicz
Attorney, Agent, or Firm—Oblon, Spivak, McClelland, Maier & Neustadt

[57] ABSTRACT

The invention provides a process for mounting an ultra-high frequency diode so as to form a pre-matched module.

The module of the invention comprises a copper base, a quartz ring and a copper cover: these three parts, coated with gold at least on their facing faces, are assembled together by thermocompression. Inside this case, the diode chip, soldered to the base via a gold heat sink is biased by a false "beam-lead" connection, a metal star whose arms are curved, which reduces the inductance and capacity of this connection with respect to the base. The false "beam-lead" is formed by metalizing a mesa obtained on a silicon wafer.

5 Claims, 2 Drawing Sheets

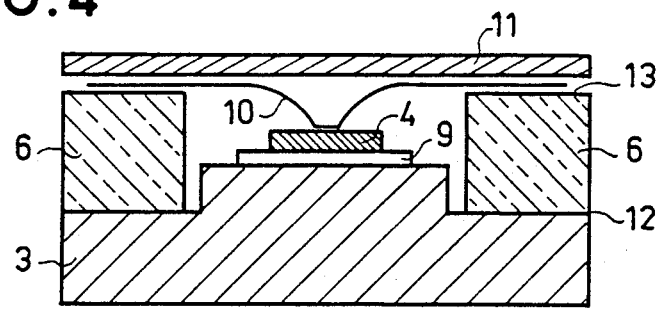
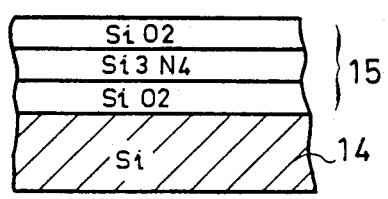
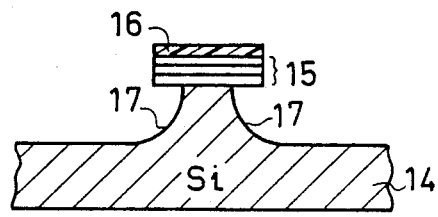
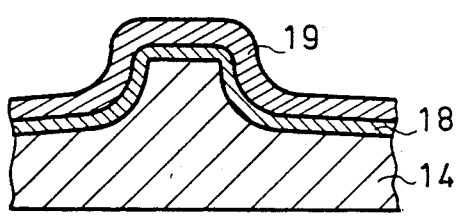
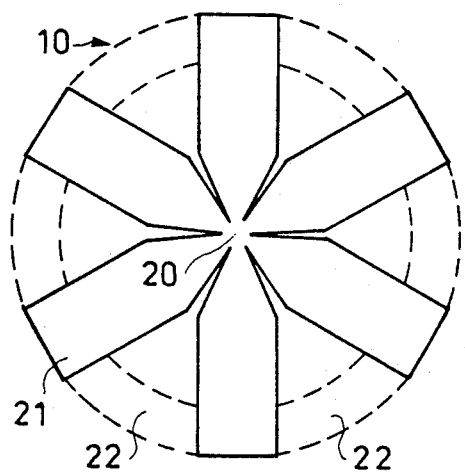

PRE-MATCHED MODULE FOR AN ULTRA-HIGH FREQUENCY DIODE AND A PROCESS FOR FORMING THE BIASING CONNECTION FOR THE DIODE

This application is a continuation of application Ser. No. 477,488, filed 3/21/83, now abandoned.

BACKGROUND OF THE INVENTION

1. Field of the Invention

The present invention relates to a process for mounting an ultra-high frequency diode so as to form a pre-matched module, by using the dimensions of the case in which the diode is sealed. The type of mounting according to the invention applies to avalanche, Gunn, Schottky and other diodes such as varactors and varicaps. The object of the invention is to seal a diode in a case so that a pre-matched module is formed, that is to say a module allowing the low impedance of the diode to be matched to the high impedance of the surrounding medium, generally air. The sealing case is formed with a thin dielectric ring, quartz being particularly well suited since it gives a low parasite capacity and a connection of the false beam-lead type so as to minimize the parasite inductance. The shape of the beam-lead also reduces the parasite capacity.

2. Discussion of Background

Impedance matching is necessary with ultra-high frequencies, for example in the 94 GHz band, for a diode which is to radiate in the space surrounding it. This matching is particularly advantageous in radial form for it may be obtained by means of an ad hoc case. At the level of the semi-conductor chip, a diode in the present instance, the impedance which it presents is of the $R+jX$ type in which R represents the real parts of the resistance and X the imaginary part of this resistance, j being equal by definition to $j^2 = -1$ and is representative of the imaginary quantities. R is negative for an avalanche diode or a Gunn diode and positive for a Schottky diode or a diode of another type. FIG. 1 will assist in better understanding the importance of impedance matching for sealing a diode in a case.

In this FIG. 1, let A be the diode in which the semi-conductor chip is soldered to a metal base and comprises an upper connection. Let $\phi_i$ be the diameter of the metal stud to which diode A is soldered, $\phi_e$ the diameter of the pedestal that is to say also of the inner diameter of the cavity, let B be the distance which separates the upper connection from the base and C the thickness of the diode, or else the distance which separates the upper connection from the stud to which the chip is soldered. The diode chip is surrounded by a dielectric of given constant, or several dielectrics of different constants, which give a mean equivalent constant. Depending on the case, the dielectric which surrounds the chip is either air or an insulation in the form of resin. It can be demonstrated that, with the impedance of the space surrounding the diode having a value $R_e + jX_e$ referred to the periphery, there exists a single set of values of $\phi_i$, $\phi_e$, B, C such that there is impedance matching of the semi-conductor device, namely:

$$R_e = k_1 R \text{ and } X_e = k_2 X$$

However, in practice, it is enough if $k_1R$ and $k_2X$ are sufficiently close to $R_e$ and $X_e$ for then the conventional mechanical tuning in the mount becomes extremely easy; this is why we say pre-matching and not matching.

This impedance transformation is extremely advantageous in particular for avalanche diodes, for it considerably simplifies the cavity: for example, biasing on the upper electrode may be provided by a simple fine wire. Furthermore, and this is shown in FIG. 2, the curve of the power delivered as a function of another variable such as the biasing current I or the ambient temperature T, is very clean without hysteresis or without snags. Thus, in FIG. 2 curve 1 represents the power curve of diodes sealed in a case without impedance matching: this curve does not have a regular variation but on the contrary presents deviations which vary moreover from one diode to another depending on the case. On the contrary, curve 2 which has a very regular variation corresponds to a diode correctly sealed in a case with impedance matching.

This shows the importance, especially at such frequencies close to 100 GHz, of a diode chip being correctly mounted and sealed in its case, which forms a cavity, preferably from parts formed collectively so as to be more industrial.

SUMMARY OF THE INVENTION

The invention describes how a collectively formed diode chip is mounted in a case with connections such that the radial impedance transformation obtained attains the desired aim, namely easy adjustment and clean operation. This is obtained on the one hand by means of connections internal to the case in the form of a metal star, called false beam-lead, because the metal strips which form the star are not flat but curved, the assembly of the star forming at its center a truncated pyramid, and on the other hand by means of a quartz ring surrounding the diode chip, this ring having a thickness less than 120 microns. The process for connecting a semi-conductor chip by means of metal beams called beam-leads is known per se, but the beams are generally flat, this is the case for the true beam-lead which causes a parasite capacity effect between the upper connection of the chip and the base on which this latter is mounted. With curved beams which are not parallel to the free surface of the base but which on the contrary diverge therefrom, and a quartz ring of a thickness less than or equal to 120 microns, the diode is matched or sufficiently matched in impedance to its external environment and its power curve as a function of other parameters such as the biasing current or the ambient temperature is very clean and without snags. Moreover, this type of mounting allows the frequency to be adjusted by light chemical etching of the chip, before the case is sealed by thermocompression.

More precisely, the invention relates to a pre-matched module for an ultra-high frequency diode, comprising a diode chip fixed inside a case formed by a metal base, a quartz ring and a metal cap, wherein, the base forms a first connection for the diode, the second connection is formed by a non flat metal star pre-formed in the shape of a corolla, whose arms have their ends bearing on the face of the quartz ring in contact with the sealing cap, and the center of which is in contact with the chip of the diode, the curvilinear form of the arms reducing the parasite inductance and capacity between this second connection and the base.

BRIEF DESCRIPTION OF THE DRAWINGS

The invention will be better understood from the description of an example of application, which refers to the accompanying figures which show:

FIG. 4: an impedance matched diode sealed in a case in accordance with the invention; and FIGS. 5 to 8: steps for manufacturing a false beam-lead.

DESCRIPTION OF THE PREFERRED EMBODIMENT

Figure 1:
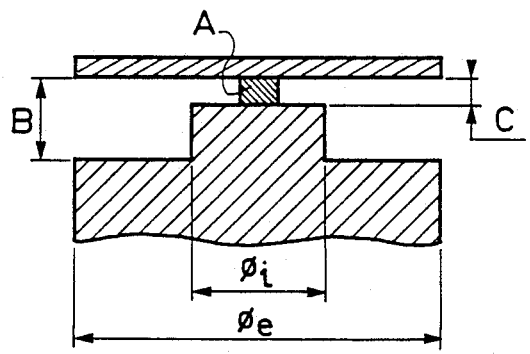
FIG. 1: a diagram for the impedance matching of a diode to the space surrounding it.
Figure 2:
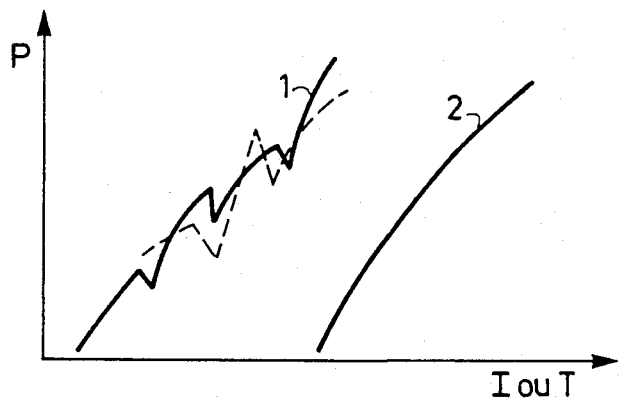
FIG. 2: the power curve of a diode as a function of its impedance transformation.
Figure 3:
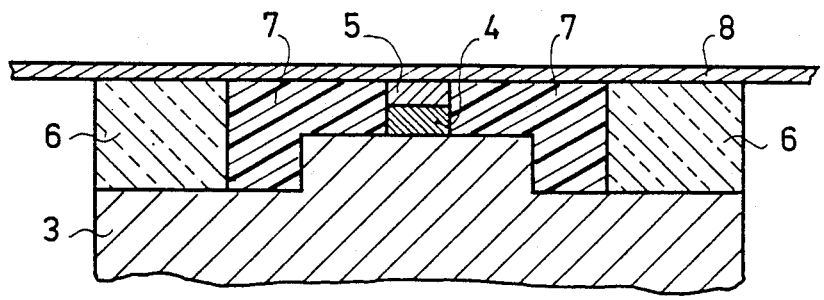
FIG. 3: an impedance matched diode sealed in a case of the prior art.

Based on the fundamental reasons outlined with reference to FIGS. 1 and 2, which show the advantage of matching the impedance of a diode to its sealing case, FIG. 3 shows one example of application of the prior art.

An approach to these impedance matching problems has already been made by the Applicant who has filed, more particularly, the patent applications 76 11442 of Apr. 16, 1976 and 78 07800 of Mar. 17, 1978. These patent applications describe mounting procedures which in fact are not sufficiently industrial for many applications.

FIG. 3 shows a part of a sealing case for a diode operating at ultra-high frequency. On a metal base 3 made from copper coated with gold, comprising a central stud, is soldered a diode chip 4, on which has been deposited beforehand a thickness of gold 5. A quartz disk 6 is bonded around the diode chip 4 to base 3 and the space between the diode chip 4 and the inside of the quartz disk 6 is filled with a resin 7. Then the assembly is lapped until the thickneess of gold 5 which was deposited on the diode chip 4 appears again by thinning down. An upper connection 8, either in the form of a metal disk or in the form of a metal star, called true beam-lead is then soldered to the thickness of gold 5, i.e. in contact with the diode, and rests at its periphery on the free face of the quartz disk 6. The assembly is then covered with a cap not shown in this figure or encased in a more complex cavity if necessary.

This type of mounting of the prior art has several disadvantages. Firstly, connection 8 which is a ribbon or a metal plate is parallel to the face of the base on which the diode is mounted and thus presents a certain not inconsiderable parasite capacity at the working frequency of the diode. And especially, secondly, this type of encasing is unitary, requires lapping and is therefore long, costly and not industrially adapted. Finally, the diode is mounted without any possibility of subsequent adjustment, for example by chemical thinning down, through light acid etching, since the diode is in fact embedded in a resin 7 and protected on both its faces by the copper base 3 and by the thickness of gold 5: since adjustment is not possible once the sealing operation has been carried out, frequency adjustment or matching is not possible either.

FIG. 4 shows a diode sealed in a case in accordance with the invention and sufficiently matched or prematched from the impedance point of view.

Chip 4 of the diode is equipped with a gold plate 9 serving as integrated heat-sink. The assembly 4 and 9 is cut out from a disk containing a very large number of assemblies and is first of all fixed to a base 3 made from copper coated with nickel and gold, generally by brazing or by thermocompression of plate 9. A quartz ring 6 is thermo-compressed, bonded or soldered to base 3 at the level of joint 12, then the upper connection 10 in the form of a false beam-lead is fixed to the chip of the diode: it bears on the upper face 13 of the quartz ring 6 and the whole is closed by means of a metal cover 11 which is also thermocompressed, bonded or brazed to the upper face of the quartz ring.

Connection 10 of the diode is, as has already been mentioned, in the form of a metal star whose arms are not flat but diverge from base 3, which reduces the parasite inductance and capacity. Since the biasing connection 10 is in the form of a star, when the diode has been fixed on the base and before lid 11 has been fitted, the oscillation frequency of the device may be adjusted by light chemical etching, which reduces the diameter of the diode chip, the introduction of the reactive liquid being possible since connection 10 has orifices between the arms of the star.

Forming this type of mounting presents few difficulties despite the very small dimensions of the assembly. By way of illustration, which is by no means limiting as regards the invention, after cutting out from a disk a semi-conductor chip such as an ultra-high frequency Impatt diode intended for operation at 94 GHz with a diameter of 35 microns, and a thickness of 5 microns, it is thermocompressed on gold part 9, 200 microns square, and of a thickness of 50 microns. The quartz ring 6, metalized on both faces 12 and 13, has an outer diameter between 750 and 800 microns, an inner diameter between 400 and 450 microns, and a thickness of the order of 100 microns if copper base 3 is flat or of the order of 150 microns if base 3 comprises a stud to which the diode is fixed. These dimensions are quoted so as to show the difficulty there is in forming a metal star which is not flat: manufacture thereof eludes the known metallurgical techniques and is explained with the help of FIGS. 5 to 8.

To form a false beam-lead star, such as the connection 10 in FIG. 4, it is necessary first of all to form a matrix from a silicon wafer—FIG. 5—on which are deposited successively a silica layer $SiO_2$ of a thickness of 0.2 micron, a silicon nitride layer $Si_3N_4$ of a thickness of 0.15 micron and a silica layer $SiO_2$ of a thickness of 0.2 micron. FIG. 6 represents the next step in forming the false beam-lead. On the preceding silicon wafer 14 covered by these three protection layers 15, zone 16 is defined by photomasking, then the protection layers are chemically etched until the silicon wafer 14 is laid bare. By continuing the chemical etching, the silicon is in its turn etched and since the chemical etching extends under the protecting layers 15, there is obtained at the end of this operation a mesa whose two sides 17 have a slightly rounded shape, which thus gives a corolla shape.

The assembly of the protection layers 15 and of the photomasking resin layer 16 are then removed.

After elimination of these protection layers, a deposit 18 of chromium/gold is then formed—FIG. 7—on the mesa thus formed. Then, after photomasking so as to obtain the desired star shape, an electrolytic growth of gold 19 is carried out, of a thickness of 2 microns, which allows the connection to be formed in false beam-lead form with several arms.

The last operation for recovering parts 10 having a bell-mouth shape and a star pattern consists in chemically etching the unmasked chromium/gold 18 and what remains of silicon 14 which served initially for forming the mesa.

FIG. 8 represents such a connection and shows the star shape which does not appear in FIG. 7. The central part 20 of this false beam-lead is the one which is thermo-compressed on the diode chip, whereas the end of each arm 21 is that which is thermocompressed on the metalized face 13 of the quartz disk 6.

The star of FIG. 8 is shown with six arms, and the number of arms is not determinative of the invention, since what is important is to form a metal connection which is not flat so as to diverge from the substrate, and which allows a liquid such as acid to flow between the arms of the star so as to be able to chemically etch the semi-conductor chip. Moreover, in FIG. 8 there is shown a particularly well adapted form of bell-shape beam-lead, that is to say that each arm of the star becomes wider progressively as it nears the outer contour of the sealing case: this solution reduces the inductance of the connection. However, other star patterns with arms formed by strips whose sides are parallel or not with respect to each other, or with a different number of arms come into the scope of the invention.

By way of example, and without this being limiting for invention, but rather to show the difficulty there would be in forming such a part by other metallurgical procedures, the false beam-lead of FIG. 8 has a diameter of the order of 720 microns; each of these arms has a length of 230 microns and a width of 120 microns in its rectangular part and the heart 20 of this metal star has sides of 50 microns: it is not possible to form such a part for example by stamping a gold foil.

When this connection in the form of a false beam-lead is fixed by thermocompression to the semi-conductor chip 4 of FIG. 4, it is is possible to test the chip for frequency before sealing the case with a cover 11 made from copper coated with nickel and gold. If the frequency is not exactly the one desired, and considering the diameter of cap 11 which determines the oscillating frequency of the pre-tuned module, by contributing to the radial impedance transformation, it is then possible to carry out a light chemical etching of chip 4 by introducing acid between the arms of the false beam-lead star 10 and rinsing. When the frequency has been adjusted as well as possible, cover 11 is fixed to the quartz disk 6 and sealing in the case is finished and tight.

If need be, for ensuring perfect sealing between the quartz disk 6 and cover 11, the false beam-lead connection 10 comprises, integrally formed therewith, a seal 22 which joins together the different arms 21 of the false beam-lead. When the case has been closed by thermocompression, this seal provides more readily a perfect seal between the arms of the false beam-lead and consequently avoids any leaks at the level of cover 11.

With the process for mounting an ultra-high frequency diode in accordance with the invention, a semiconductor is obtained which is adjustable in frequency by a chemical process, for it is not coated with a polymer or a resin and its radical impedance transformation is provided by the very dimensions of the case, this latter being able to be thermocompressed, and not bonded as is generally the case. This invention is specified in the following claims.

What is claimed is:

1. A pre-impedance matched module for an ultra-high frequency diode, comprising a diode chip fixed inside a case wherein said case includes a metal base, a dielectric ring, having a diameter between 750 microns and 800 microns and a metal cover and wherein said base forms a first connection means to connect said base to said diode and wherein said cover is connected to said diode by a second connection means wherein said second connection means is internal to said case and is located between said cover and said diode chip and further wherein said second connection means is a single monolithic metallic sheet which is formed in the shape of a star comprising a plurality of metal strips formed from said single metallic sheet, which forms at its center a truncated pyramid with each of said metal strips being curved and with the ends of each of said metal strips bearing on the face of said dielectric ring in contact with said cover, and wherein the center of said shaped star is in contact with said chip of said diode whereby the curvilinear form of said strips reduce the parasitic inductance and capacitance between said base and said second connection means.

2. Pre-impedance matched module as claimed in claim 1, wherein the oscillation frequency of the module is preadjusted by chemical etching of the diode chip, by introducing acid between said curved strips of said star shaped second connection means wherein said etching is accomplished prior to closing said cover.

3. The pre-matched module as claimed in claim 1, wherein, with said dielectric ring and said cover metalized by coating their opposite faces with gold, the case of the module is closed by thermocompression of said dielectric ring on said base and then of said cover on said dielectric ring.

4. The pre-matched module as claimed in claim 1, wherein said dielectric ring has 800 microns and the cover ensures, by its diameter, the radial impedance transformation of the diode at the oscillation frequency of the module.

5. The pre-tuned module as claimed in claim 1, wherein said dielectric ring is made from quartz.

* * * * *